(12) United States Patent
Cai

(10) Patent No.: US 9,917,574 B2
(45) Date of Patent: Mar. 13, 2018

(54) SWITCHING CIRCUIT

(71) Applicant: DELTA ELECTRONICS, INC., Taoyuan (TW)

(72) Inventor: Chao-Feng Cai, Taoyuan (TW)

(73) Assignee: DELTA ELECTRONICS, INC., Taoyuan (TW)

( * ) Notice: Subject to any disclaimer, the term of this patent is extended or adjusted under 35 U.S.C. 154(b) by 0 days.

(21) Appl. No.: 15/007,169

(22) Filed: Jan. 26, 2016

(65) Prior Publication Data

US 2016/0344381 A1    Nov. 24, 2016

(30) Foreign Application Priority Data

May 21, 2015    (CN) .......................... 2015 1 0262220

(51) Int. Cl.
| | |
|---|---|
| *H03L 5/00* | (2006.01) |
| *H03K 17/041* | (2006.01) |
| *H03K 17/687* | (2006.01) |
| *H03K 17/082* | (2006.01) |
| *H03K 17/16* | (2006.01) |

(52) U.S. Cl.
CPC ... *H03K 17/04106* (2013.01); *H03K 17/0822* (2013.01); *H03K 17/165* (2013.01); *H03K 17/168* (2013.01); *H03K 17/6871* (2013.01)

(58) Field of Classification Search
CPC .............................................. H03K 17/04106
USPC ............................. 327/333; 257/77; 323/271
See application file for complete search history.

(56) References Cited

U.S. PATENT DOCUMENTS

| | | | |
|---|---|---|---|
| 6,320,414 B1 | 11/2001 | Annema et al. | |
| 7,719,055 B1 | 5/2010 | McNutt et al. | |
| 9,401,356 B2* | 7/2016 | Zeng | ........................ H02M 1/08 |
| 2009/0278513 A1 | 11/2009 | Bahramian et al. | |
| 2010/0295102 A1 | 11/2010 | Sankin et al. | |
| 2011/0254018 A1* | 10/2011 | Domes | .................. H03K 17/063 |
| | | | 257/77 |
| 2012/0241756 A1 | 9/2012 | Zhang et al. | |
| 2015/0311796 A1* | 10/2015 | Dubois | .................... H02M 1/08 |
| | | | 323/271 |

FOREIGN PATENT DOCUMENTS

| | | |
|---|---|---|
| CN | 102185286 A | 9/2011 |
| TW | I439841 B | 6/2014 |
| TW | 201503583 A | 1/2015 |

* cited by examiner

*Primary Examiner* — Lincoln Donovan
*Assistant Examiner* — Metasebia Retebo
(74) *Attorney, Agent, or Firm* — CKC & Partners Co., Ltd.

(57) ABSTRACT

A switching circuit is disclosed. The switching circuit includes a normally-on switching element, a normally-off switching element, a switching unit and a power source. The drain of the normally-off switching element is electrically connected to the source of the normally-on switching element. The source of the normally-off switching element is electrically connected to the gate of the normally-on switching element. The power source and the switching unit are configured to form a serial-connected branch. A first terminal of the serial-connected branch is electrically connected to the drain of the normally-off switching element. A second terminal of the serial-connected branch is electrically connected to the source of the normally-off switching element.

21 Claims, 10 Drawing Sheets

SWITCHING CIRCUIT

RELATED APPLICATIONS

This application claims priority to China Application Serial Number 201510262220.6, filed May 21, 2015, which is herein incorporated by reference.

BACKGROUND

Technical Field

The present disclosure relates to a switching circuit, and in particular, to a power switching circuit.

Description of Related Art

Recently, as the performance of the conventional power semiconductor switch reaches the theoretical limitation of the material itself, technology of the normally-on switching element using wide bandgap power semiconductors such as SiC and GaN semiconductor material are developed rapidly.

However, the drawback of the normally-on switching elements using the aforementioned semiconductor material exists no matter whether a conventional direct driving method is adopted or an indirect driving method with a cascade circuit of a high voltage normally-on switching element and the low voltage normally-off switching element is adopted. For example, in the driving method with the cascade circuit used in recent days, the turn-off speed of the high voltage normally-on switching element is low under the small current, and the bias voltage between the gate and the source of the high voltage normally-on switching element cannot be controlled directly, and thus the risk of the high voltage normally-on switching element being broken down is increased. In addition, due to the significant loss of the reverse recovery by the parasitic capacitance of the low voltage normally-off switching element, so it cannot be applied in high frequency circuits.

Therefore, an important area of research in which to improve the switching response time of the normally-on switching element under different working current requirements, and control the voltage level of the gate of the high voltage normally-on switching element steadily and lower the loss of the reverse recovery at the same time.

SUMMARY

To solve the problem stated above, one aspect of the present disclosure is a switching circuit. The switching circuit includes a normally-on switching element, a normally-off switching element, a switching unit and a power source. The drain of the normally-off switching element is electrically connected to the source of the normally-on switching element. The source of the normally-off switching element is electrically connected to the gate of the normally-on switching element. The power and the switching unit are configured to form a serial-connected branch. A first terminal of the serial-connected branch is electrically connected to the drain of the normally-off switching element. A second terminal of the serial-connected branch is electrically connected to the source of the normally-off switching element.

In summary, technical solutions of the present disclosure have advantages and beneficial effects compared to present technical solutions. The aforementioned technical solutions can be widely used in industry. In the present disclosure, by the circuit design of arranging the switching unit, the voltage level of the gate of the high voltage normally-on switching element is controlled steadily as well as the high speed switching performance is maintained.

It is to be understood that both the foregoing general description and the following detailed description are by examples, and are intended to provide further explanation of the disclosure as claimed.

BRIEF DESCRIPTION OF THE DRAWINGS

The disclosure can be more fully understood by reading the following detailed description of the embodiments, with reference made to the accompanying drawings as follows.

DETAILED DESCRIPTION

Figure 1:
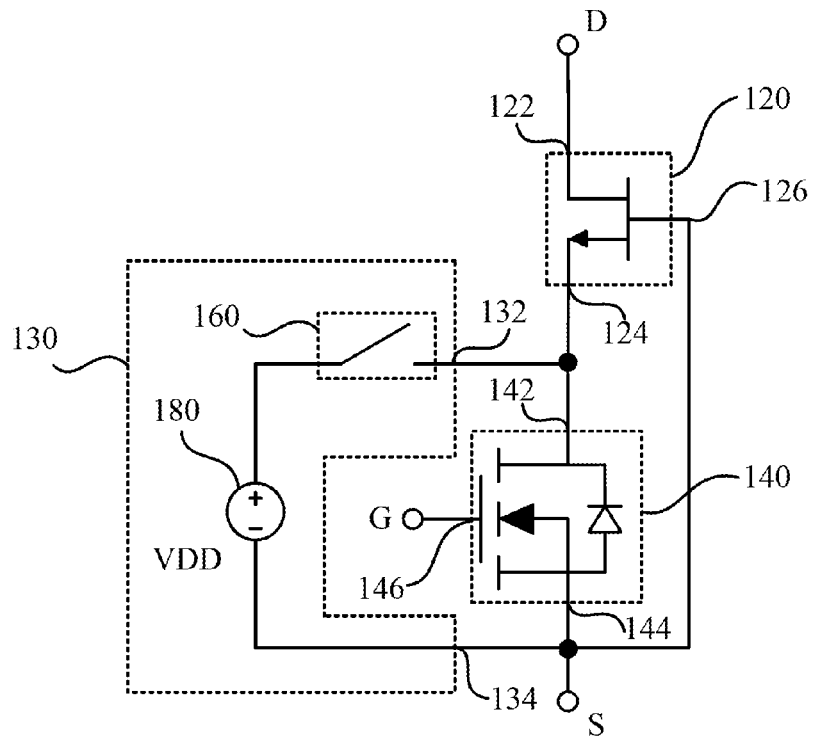
FIG. 1 and FIG. 2 are diagrams illustrating a switching circuit according to an embodiment of the present disclosure.

Reference will now be made in detail to embodiments of the present disclosure, examples of which are described herein and illustrated in the accompanying drawings. While the disclosure will be described in conjunction with embodiments, it will be understood that they are not intended to limit the disclosure to these embodiments. On the contrary, the disclosure is intended to cover alternatives, modifications and equivalents, which may be included within the spirit and scope of the disclosure as defined by the appended claims. It is noted that, in accordance with the standard practice in the industry, the drawings are only used for understanding and are not drawn to scale. Hence, the drawings are not meant to limit the actual embodiments of the present disclosure. In fact, the dimensions of the various features may be arbitrarily increased or reduced for clarity of discussion. Wherever possible, the same reference numbers are used in the drawings and the description to refer to the same or like parts for better understanding.

The terms used in this specification and claims, unless otherwise stated, generally have their ordinary meanings in the art, within the context of the disclosure, and in the specific context where each term is used. Certain terms that are used to describe the disclosure are discussed below, or elsewhere in the specification, to provide additional guidance to the practitioner skilled in the art regarding the description of the disclosure.

The terms "about" and "approximately" in the disclosure are used as equivalents. Any numerals used in this disclosure with or without "about," "approximately," etc. are meant to cover any normal fluctuations appreciated by one of ordinary skill in the relevant art. In certain embodiments, the term "approximately" or "about" refers to a range of values that fall within 20%, 10%, 5%, or less in either direction (greater or less than) of the stated reference value unless otherwise stated or otherwise evident from the context.

In the following description and in the claims, the terms "include" and "comprise" are used in an open-ended fashion, and thus should be interpreted to mean "include, but not limited to." As used herein, the term "and/or" includes any and all combinations of one or more of the associated listed items.

In this document, the term "coupled" may also be termed "electrically coupled," and the term "connected" may be termed "electrically connected." "Coupled" and "connected" may also be used to indicate that two or more elements cooperate or interact with each other. It will be understood that, although the terms "first," "second," etc., may be used herein to describe various elements, these elements should not be limited by these terms. These terms are used to distinguish one element from another. For example, a first element could be termed a second element, and, similarly, a second element could be termed a first element, without departing from the scope of the embodiments.

Reference is made to FIG. 1. FIG. 1 is a diagram illustrating a switching circuit 100a according to an embodiment of the present disclosure. In the present embodiment, the switching circuit 100a includes a normally-on switching element 120, a normally-off switching element 140, a switching unit 160 and a power source 180. As shown in FIG. 1, the drain 142 of the normally-off switching element 140 is electrically connected to the source 124 of the normally-on switching element 120, the source 144 of the normally-off switching element 140 is electrically connected to the gate 126 of the normally-on switching element 120 and thus forms a cascade circuit structure.

The power source 180 and the switching unit 160 are electrically connected in series and configured to form a serial-connected branch 130. The two terminals of the serial-connected branch 130 are connected to the drain 142 and the source 144 of the normally-off switching element 140 respectively. Specifically, a first terminal 132 of the serial-connected branch 130 is electrically connected to the drain 142 of the normally-off switching element 140, and a second terminal 134 of the serial-connected branch 130 is electrically connected to the source 144 of the normally-off switching element 140.

In the present embodiment, the normally-on switching element 120, the normally-off switching element 140, and the switching unit 160 may be implemented by different types of transistors such as metal-oxide-semiconductors field-effect transistors (MOSFETs), bipolar junction transistors (BJTs), junction field-effect transistors (JFETs), etc. The material of the transistors may choose conventional silicon based semiconductor materials or any wide bandgap semiconductor materials such as SiC, GaN, C, etc.

In the present embodiment the power source 180 may be a dc source and may also be implemented by other elements (e.g., decoupling capacitors or circuits with decoupling capacitors and the dc source connected in parallel), and configured to provide a dc level VDD. In order to ensure the proper operation of the switching circuit 100a, the range of the dc level VDD is determined by a gate threshold voltage $V_{TH\_M1}$ of the normally-on switching element 120 and a lower limit $V_{MIN\_GATE}$ of the safe operating area for the gate voltage of the normally-on switching element 120.

Specifically, in the present embodiment, the value of the dc level VDD satisfies the following equation:

$$-V_{TH\_M1} \leq VDD \leq -V_{MIN\_GATE}$$

to maintain the voltage of the gate 126 of the normally-on switching element 120 in the safe operating area in order to prevent the gate 126 of the normally-on switching element 120 from being broken down, in which the detail operations will be explained in the following paragraphs.

When the control circuit is configured to turn off the switching circuit 100a, first, the gate 146 (i.e., the gate G of the switching circuit 100a) of the normally-off switching element 140 receives a control signal from the control circuit such that the normally-off switching element 140 is turned off. At this time, the voltage difference between the drain 142 and the source 144 of the normally-off switching element 140 begins to increase. Alternatively stated, the voltage difference between the gate 126 and the source 124 of the normally-on switching element 120 is start to decrease gradually.

When the voltage difference between the gate 126 and the source 124 of the normally-on switching element 120 is lower than the gate threshold voltage $V_{TH\_M1}$, the normally-on switching element 120 is configured to switch from on to off. Due to the fact that parasitic capacitance between the drain and the source of the normally-on switching element 120 exists, when the parasitic capacitance between the drain and the source is further charged, the voltage of the drain 142 of the normally-off switching element 140 is further increased such that the voltage difference between the gate 126 and the source 124 of the normally-on switching element 120 is about to reach the lower limit $V_{MIN\_GATE}$ of the safe operating area.

At this time, the switching unit 160 is configured to be on such that the serial-connected branch 130 is on to limit the voltage difference between the drain 142 and the source 144 of the normally-off switching 140 at the dc level VDD to prevent the voltage difference between the gate 126 and the source 124 of the normally-on switching element 120 being too large and causing the damage of the normally-on switching element 120.

Alternatively stated, when the serial-connected branch 130 is on, the voltage difference between the gate 126 and the source 124 of the normally-on switching element 120 (i.e., the negative value of the dc level VDD, -VDD) is smaller than the gate threshold voltage $V_{TH\_M1}$ of the normally-on switching element 120 to keep the normally-on switching element 120 remaining off, and is larger than the lower limit $V_{MIN\_GATE}$ of the safe operating area for the gate voltage to prevent the normally-on switching element 120 being damaged, or:

$$V_{MIN\_GATE} \leq -VDD \leq V_{TH\_M1}.$$

One can rewrite the above equation and the range of the dc level VDD may be shown as:

$$-V_{TH\_M1} \leq VDD \leq -V_{MIN\_GATE}.$$

It is noted that due to the fact that the normally-on switching element 120 is normally-on, the lower limit $V_{MIN\_GATE}$ of the safe operating area for the gate voltage and the gate threshold voltage $V_{TH\_M1}$ are negative values.

Thus, by configuring the dc level properly, the voltage of the gate 126 of the normally-on switching element 120 can be controlled and the elements in the switching circuit 100a can be prevented from damage.

It is noted that to ensure the proper function of the switching circuit 100a, a withstand voltage $V_{BR}$ of the normally-off switching element 140 and the switching unit 160 is larger than the dc level VDD. Alternatively stated, the withstand voltage $V_{BR}$ of the normally-off switching element 140 and the switching unit 160 and the dc level VDD satisfies the following equation:

$$VDD \leq V_{BR}$$

In the embodiment shown in FIG. 1, the first terminal of the switching unit 160 (i.e., the first terminal 132 of the serial-connected branch 130) is electrically connected to the drain 142 of the normally-off switching element 140, and the second terminal of the switching unit 160 is electrically connected to the first terminal (e.g., the positive terminal) of the power source 180, and the second terminal (e.g., the negative terminal, i.e., the second terminal 134 of the serial-connected branch 130) of the power source 180 is electrically connected to the source 144 of the normally-off switching element 140 to form the serial-connected branch 130. However, it is not meant to limit the present disclosure. The serial-connected branch 130 may be implemented in various connecting ways.

Figure 2:
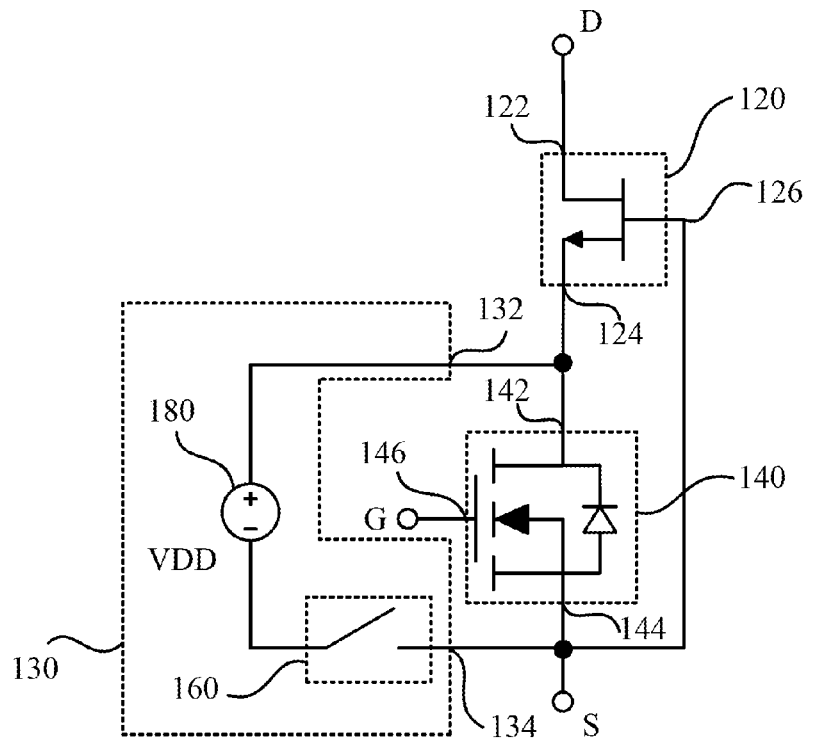

For example, the embodiment shown in FIG. 2 is also a possible implementation way of the present disclosure. FIG. 2 is a diagram illustrating a switching circuit 100b according to another embodiment of the present disclosure. Compared to the embodiment shown in FIG. 1, in the embodiment shown in FIG. 2, the first terminal (e.g., the positive terminal, i.e., the first terminal 132 of the serial-connected branch 130) of the power source 180 is electrically connected to the drain 142 of the normally-off switching element 140, and the second terminal (e.g., the negative terminal) of the power source 180 is electrically connected to the first terminal of the switching unit 160, and the second terminal of the switching unit 160 (i.e., the second terminal 134 of the serial-connected branch 130) is electrically connected to the source 144 of the normally-off switching element 140 to form the serial-connected branch 130.

The switching circuit 100b in the present embodiment may also control the voltage of the gate 126 of the normally-on switching element 120 by configuring the dc level VDD properly so as to avoid the damage of the element in the switching circuit 100b, in which the detail operating method is similar to the embodiment shown in FIG. 1 and omitted herein for the sake of brevity.

Figure 3A:
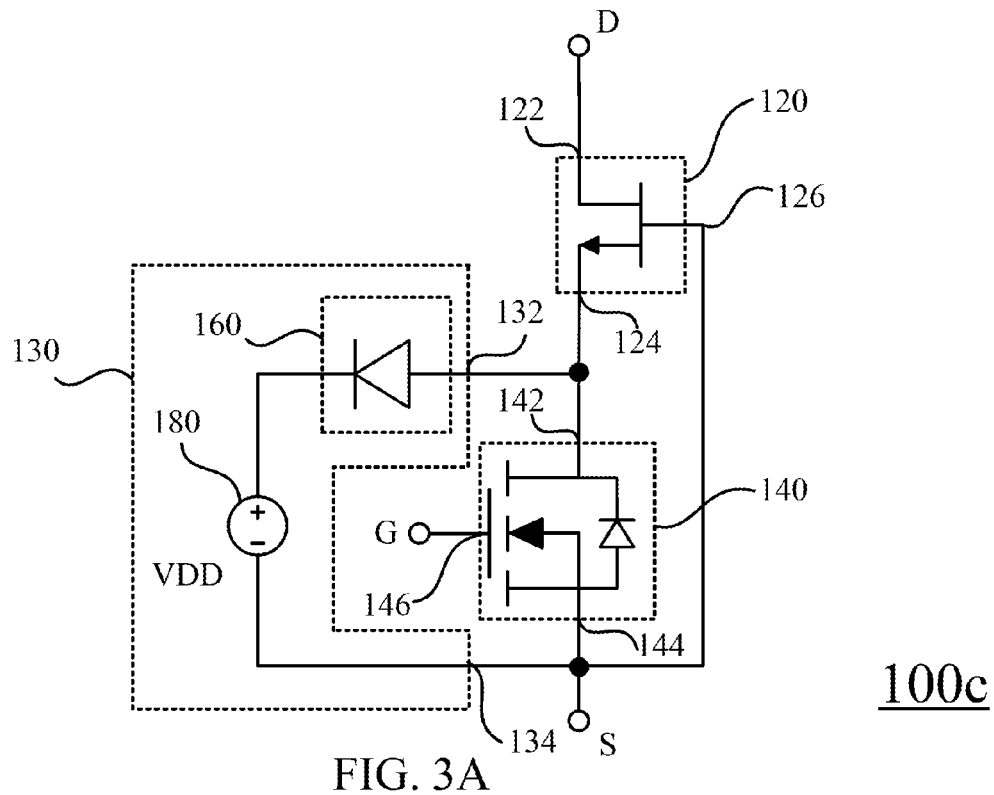
FIG. 3A-3C are diagrams illustrating a switching circuit according to an embodiment of the present disclosure.
Figure 3B:
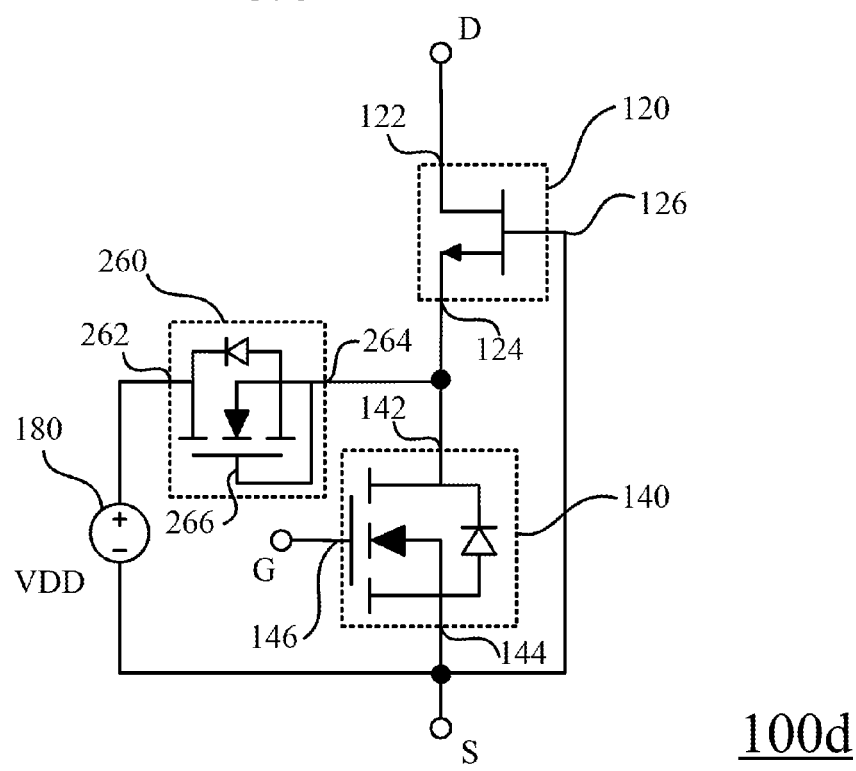

The switching unit 160 of the embodiments shown in the FIG. 1 and FIG. 2 may be implemented in various ways. Reference is made to FIG. 3A and FIG. 3B for the detailed implementation. FIG. 3A is a diagram illustrating a switching circuit 100c according to another embodiment of the present disclosure. Compared to the embodiment shown in FIG. 1, in the embodiment shown in FIG. 3A and FIG. 3B, the switching unit 160 and 260 is a unidirectional conducting element. In the present embodiment, when the voltage of the drain 142 of the normally-off switching element 140 increases such that the voltage difference between the drain 142 and the source 144 is larger than the dc level VDD, the switching unit 160 and 260 are configured to turn on the serial-connected branch 130 automatically so as to limit the voltage difference between the drain 142 and the source 144 at the dc level VDD and avoid the damage of the normally-on switching element 120.

As shown in FIG. 3A, the unidirectional conducting element may be implemented by various diode elements well known to one skilled in the art. As shown in the figure, the first terminal (e.g., the anode) of the switching unit 160 is electrically connected to the source 124 of the normally-on switching element 120, and the second terminal (e.g., the cathode) of the switching unit 160 is electrically connected to the positive terminal of the power source 180.

FIG. 3B is a diagram illustrating a switching circuit 100d according to another embodiment of the present disclosure. Compared to the embodiment shown in FIG. 1, in the embodiment shown in FIG. 3B, the switching unit 160 is implemented by a metal-oxide-semiconductor field-effect transistor (MOSFET) to achieve the unidirectional conducting function. As shown in the FIG. 3B, the gate 266 and the source 264 of the switching unit 260 is short-connected and electrically connected to the source 124 of the normally-on switching element 120 so as to forward-block the switching unit 260. The drain 262 of the switching unit 260 is electrically connected to the positive terminal of the power source 180, so as to achieve the unidirectional conducting function using the reverse conduction of the MOSFET. It is noted that although the MOSFET is used in the present embodiment to achieve the unidirectional conducting function, it is not meant to limit the present disclosure. One skilled in the art may choose various transistors switching elements, such as junction field-effect transistor (JFET) to achieve the above function.

In the embodiment shown in FIG. 3A and FIG. 3B, the drain 122 (e.g., D) of the normally-on switching element 120 is the input terminal, and the source 144 (i.e., S) of the normally-off switching element 140 is the output terminal, and the gate 146 (i.e., G) of the normally-off switching element 140 is configured to receive the control signal to control the switching circuit 100c and 100d to be on or off.

Take the embodiment shown in FIG. 3B as an example, when the gate 146 of the normally-off switching element 140 receive a control signal to turn off the switching circuit 100d, at first, the normally-off switching element 140 turns off directly and start to withstand the voltage such that the voltage between the drain 142 and the source 144 increases. The voltage between the gate 126 and the source 124 of the normally-on switching element is the opposite value of the voltage between the drain 142 and the source 144, so as the voltage between the drain 142 and the source 144 increases, the voltage between the gate 126 and the source 124 is pulled down gradually. When the voltage between the gate 126 and the source 124 is lower than the gate threshold voltage $V_{TH\_M1}$, the normally-on switching element 120 turns off and begins to withstand the voltage between the drain 122 and the source 124.

Due to the fact that parasitic capacitance Cds between the drain 122 and the source 124 of the normally-on switching element 120 exists, when the parasitic capacitance Cds is charged, the voltage between the drain 142 and the source 144 of the normally-off switching element 140 is further increased, such that the voltage difference between the gate 126 and the source 124 of the normally-on switching element 120 is about to reach the lower limit $V_{MIN\_GATE}$ of the safe operating area.

When voltage between the drain 142 and the source 144 of the normally-off switching element 140 is larger than the dc level VDD, the switching unit 160 (or the switching unit 260) is configured to turn on the serial-connected branch 130 so as to control the voltage between the drain 142 and the source 144 of the normally-off switching element 140 is maintain at the dc level VDD. Thus, the voltage between the gate 126 and the source 124 of the normally-on switching element 120 is maintained at the negative value of the dc level VDD (i.e., −VDD) and will not further decrease.

As mentioned in the above paragraph, due to the fact that the dc level VDD in configured to be larger than the opposite value of the gate threshold voltage $V_{TH\_M1}$ (i.e, $-V_{TH\_M1}$), and smaller than the opposite value of the lower limit $V_{MIN\_GATE}$ of the safe operating area (i.e., $-V_{MIN\_GATE}$), the voltage between the gate 126 and the source 124 (i.e., −VDD) is indirectly controlled not to be smaller than the value of the lower limit $V_{MIN\_GATE}$ of the safe operating area, and therefore the voltage of the normally-on switching element 120 is kept at the safe operating area and the damage of the elements in the switching circuit 100d is prevented.

On the other hand, when the gate 146 of the normally-off switching element 140 receives a control signal to turn on the switching circuit 100d, at first, the normally-off switching element 140 is on directly, such that the voltage between the drain 142 and the source 144 starts to decrease, and correspondingly, the voltage between the gate 126 and the source 124 gradually increases to be larger than the gate threshold voltage $V_{TH\_M1}$, and thus the normally-on switching element 120 is turned on. Thus, the switching circuit 100d is turned on fluently and not been affected by the power source 180.

Via the dc level VDD set by the power source 180 and the accompanying unidirectional conducting switching unit 260 (or the switching unit 160), the voltage of the normally-on switching element 120 may be controlled in the safe area, and thus the choice of the normally-off switching element 140 could be more flexible. For example, a normally-off switching element 140 with smaller parasitic parameter may be chosen to speed up the turn off speed of the normally-on switching element 120 and lower the total loss of the system.

Figure 3C:
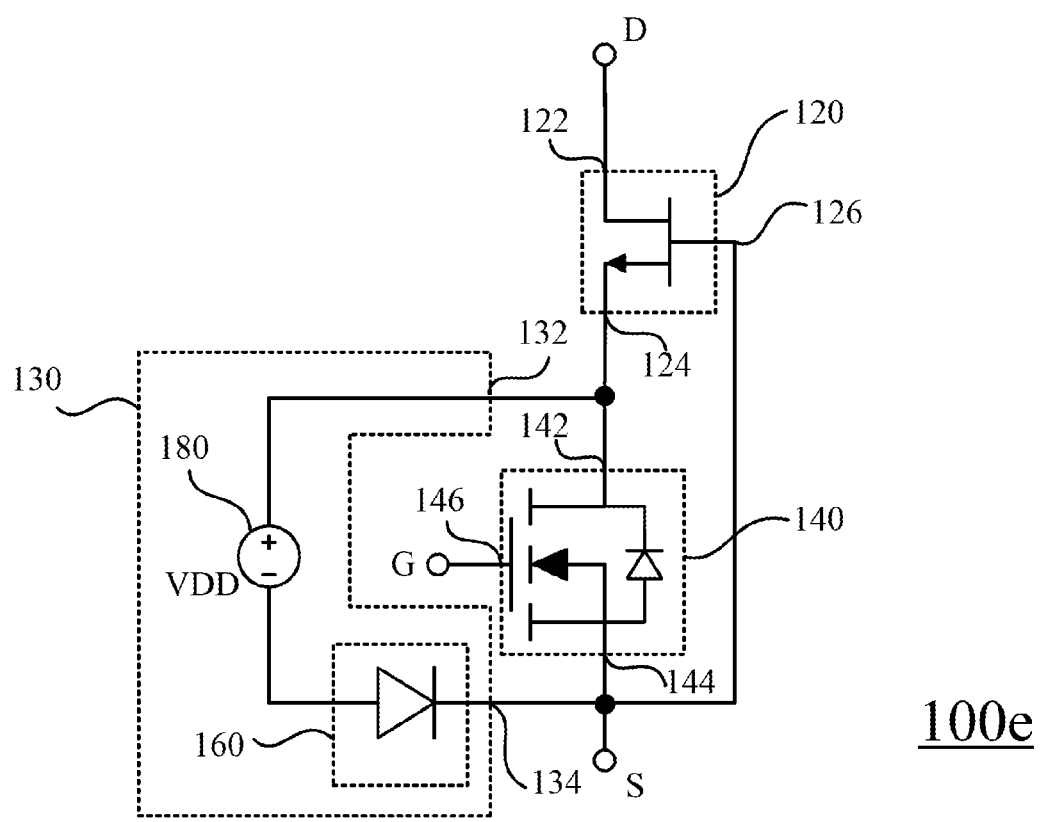

It is noted that the switching unit 160 and 260 with the unidirectional conducting ability shown in FIG. 3A and FIG. 3B may be applied in the circuit shown in FIG. 2. Reference is made to FIG. 3C. FIG. 3C is a diagram illustrating a switching circuit 100e according to another embodiment of the present disclosure. In the present embodiment, the first terminal (e.g., anode) of the switching unit 160 is electrically connected to the negative terminal of the power source 180, and the second terminal (i.e., cathode) of the switching unit 160 is electrically connected to the source 144 of the normally-off switching element 140 to achieve the similar effect. One skilled in the art can understand that, when applied in the circuit shown in FIG. 2, the switching unit 160 has a symmetrical structure and achieves similar functions as the switching unit 160 applied in the circuit shown in FIG. 1, and thus a further explanation is omitted herein for the sake of brevity.

Figure 4:
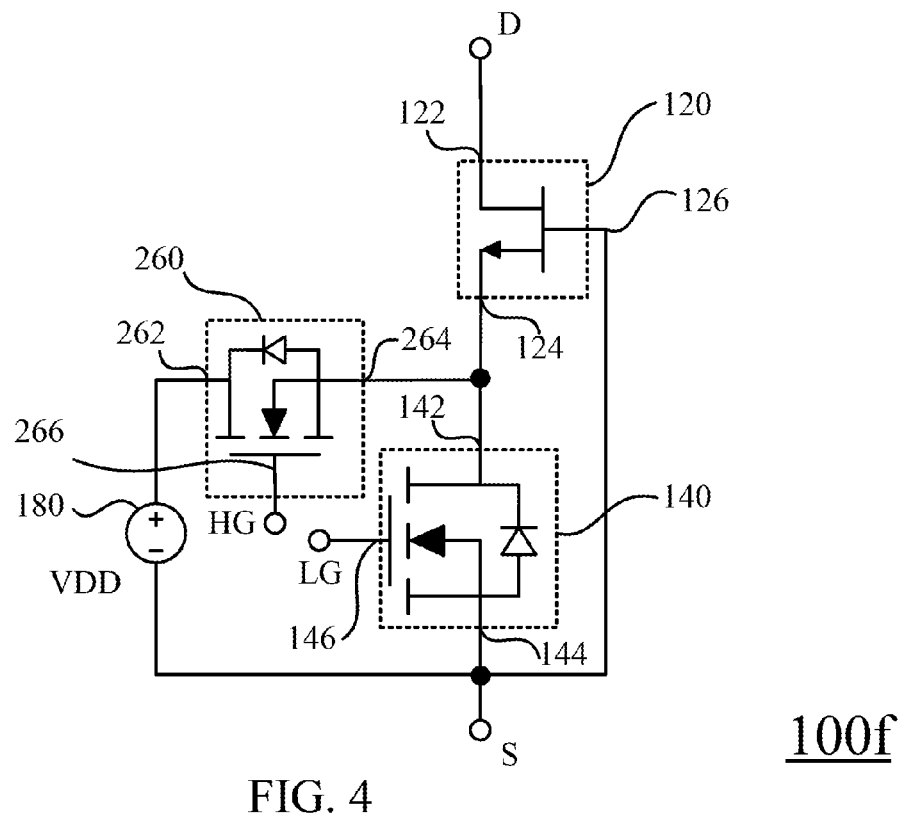
FIG. 4 is a diagram illustrating a switching circuit according to an embodiment of the present disclosure.

Reference is made to FIG. 4. FIG. 4 is a diagram illustrating a switching circuit 100f according to another embodiment of the present disclosure.

As shown in the FIG. 4, the normally-off switching element 140 and the switching unit 260 are n-type metal-oxide-semiconductor field-effect transistors, in which the normally-off switching element 140 is configured to be on or off according to the control signal LG, and the switching unit 260 is configured to be on or off according to the control signal HG. The source 264 of the switching unit 260 is electrically connected to the drain 142 of the normally-off switching element 140. The power source 180 is configured to provide the dc level VDD, and the drain 262 of the switching unit 260 is electrically connected to the positive terminal of the power source 180, and the source 144 of the normally-off switching element 140 is electrically connected to the negative terminal of the power source 180.

Figure 5:
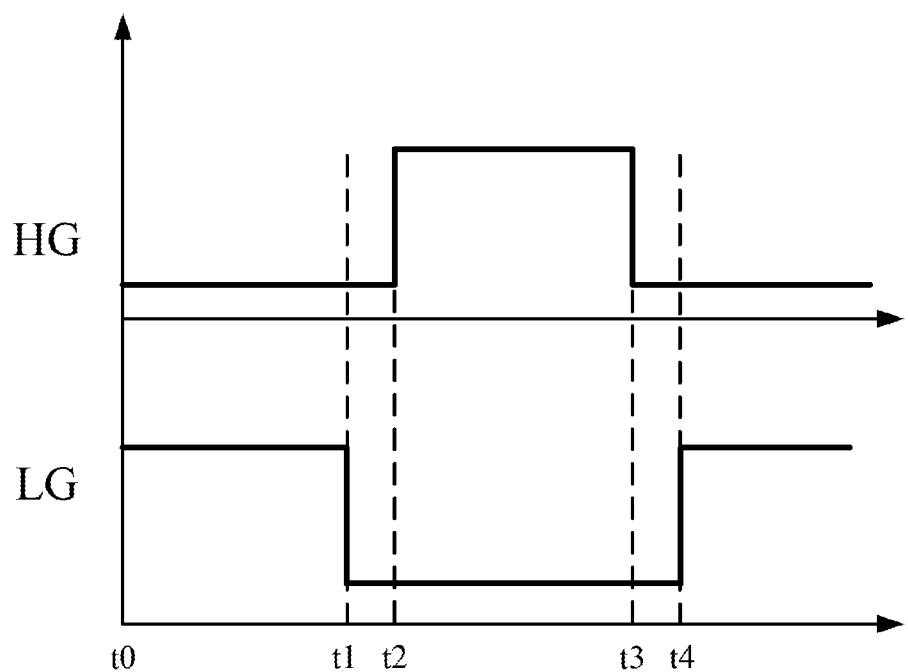
FIG. 5 is a diagram illustrating control signals according to an embodiment of the present disclosure.

Reference is made to FIG. 5 in accordance. FIG. 5 is a diagram illustrating the control signal LG and HG according to an embodiment of the present disclosure. For better understanding of the present disclosure, the detailed operating method of the control signal LG and HG controlling the normally-off switching element 140 and the switching unit 260 to be on or off respectively is discussed in relation to the embodiment shown in FIG. 4, but the present disclosure is not limited thereto.

As shown in FIG. 5, the first control signal LG configured to control the normally-off switching element 140 is opposite to the second control signal HG configured to control the switching unit 260. Alternatively stated, when the normally-off switching element 140 is configured to be off, the switching unit 260 is configured to be on. On the other hand, when the normally-off switching element 140 is configured to be on, the switching unit 260 is configured to be off. In addition, as shown in the figure, in order to make sure the normally-off switching element 140 and the switching unit 260 do not turn on at the same time to form a short circuit, a dead time region is preserved at the edge of the control signal LG and HG.

Alternatively stated, during a turn-off process of the switching circuit 100f, the voltage level (i.e., the first control signal LG) of the gate 146 of the normally-off switching element 140 is switched from a high level to a low level at a first time t1, and the voltage (i.e., the second control signal HG) of the gate 266 of the switching unit 260 is switched from a low level to a high level at a second time t2 after the first time t1. The region between the first time t1 and the second time t2 is the dead time region preserved.

Similarly, during a turn-on process of the switching circuit 100f, the voltage level (i.e., the second control signal HG) of the gate 266 of the switching unit 260 is switched from the high level to the low level at a third time t3, and the voltage (i.e., the first control signal LG) of the gate 146 of the normally-off switching element 140 is switched from the low level to the high level at a fourth time t4 after the third time t3. The region between the third time t3 and the fourth time t4 is the dead time region preserved.

When the switching circuit is applied with different current levels, the dead time, or the value of the time difference between the first time and the second time, and the time difference between the third time and the fourth time is between about 0.01 nanoseconds and about 1 microsecond.

Thus, during the turn-off process of the switching circuit 100f, after the dead time, the switching unit 260 is turned on at the second time t2 such that the compensating driving current flows in from the power source 180 and speed up the charging of the parasitic capacitor between the drain 142 and the source 144 of the normally-off switching element 140, and speed up the charging of the parasitic capacitor between the gate 126 and the source 124 of the normally-on switching element 120 to speed up the turn-off of the normally-on switching element 120.

In addition, similar to the aforementioned embodiment, after the normally-on switching element 120 turned off, due to the turn-on of the switching unit 260, the voltage between the drain 142 and the source 144 of the normally-off switching element 140 is clamped at the dc level VDD, and the voltage between the gate 126 and the source 124 (i.e., −VDD) is indirectly controlled not to be smaller than the value of the lower limit $V_{MAIN\_GATE}$ of the safe operating area, and therefore the voltage of the normally-on switching element 120 is kept at the safe operating area and the damage of the elements in the switching circuit 100f is prevented.

On the other hand, during the turn-on process of the switching circuit 100f, the switching unit 260 is turned off at the third time t3, and then after a period of the dead time, the normally-off switching element 140 is turned on. Because the switching unit 260 is turned off already when the normally-off switching element 140 is turned on, the power source 180 will not affect the turn-on process. The turn-on process of the switching circuit 100f is similar to the embodiment disclosed above and further explanation is omitted herein for the sake of brevity.

It is noted that when the normally-off switching element 140 is on and the switching unit 260 is off, there is no obvious bias on the gate of the normally-on switching element 120 and the normally-on switching element 120 is turned on normally. Under this situation, the reversed current may flow through the channel of the normally-off switching element 140, and the switching circuit 100f has a reverse conducting function and a synchronous rectifying ability.

On the other hand, when the normally-off switching element 140 is off and the switching unit 260 is on, the normally-on switching element 120 is in a forward blocking state. Under this situation, if the normally-on switching element 120 has the reverse conducing ability (i.e., MOSFET, JEFT, High electron mobility transistor, etc.), the reversed current may flow through the path formed by the power source 180, the switching unit 260, and the normally-on switching element 120 to achieve a freewheeling function. In this path, the reversed current does not flow through any parasitic diodes of the semiconductor element, so the reverse recovery problem caused by the minority carrier storage effect is solved.

Thus, by the aforementioned circuit structure of the switching circuit 100f and the corresponding operation of the control signal LG and HG, in the present embodiment, the gate of the normally-on switching element 120 is protected, the switching speed of the normally-on switching element 120 is increased, the reversed freewheeling function and minority-carrier-storage-free or reverse-recovery-free ability are achieved, and the reverse recovery issues are solved under the situation that the normally-off switching element 140 has parasitic diodes. In addition, when the normally-off switching element 140 is off, the voltage between the gate 126 and the source 124 of the normally-on switching element 120 are clamped by the power source 180 via the switching unit 260, and the abnormal operation of the switching circuit 100f due to the pre-activation of the normally-on switching element 120 when the normally-on switching element 120 achieves the soft start is avoided.

Figure 6:
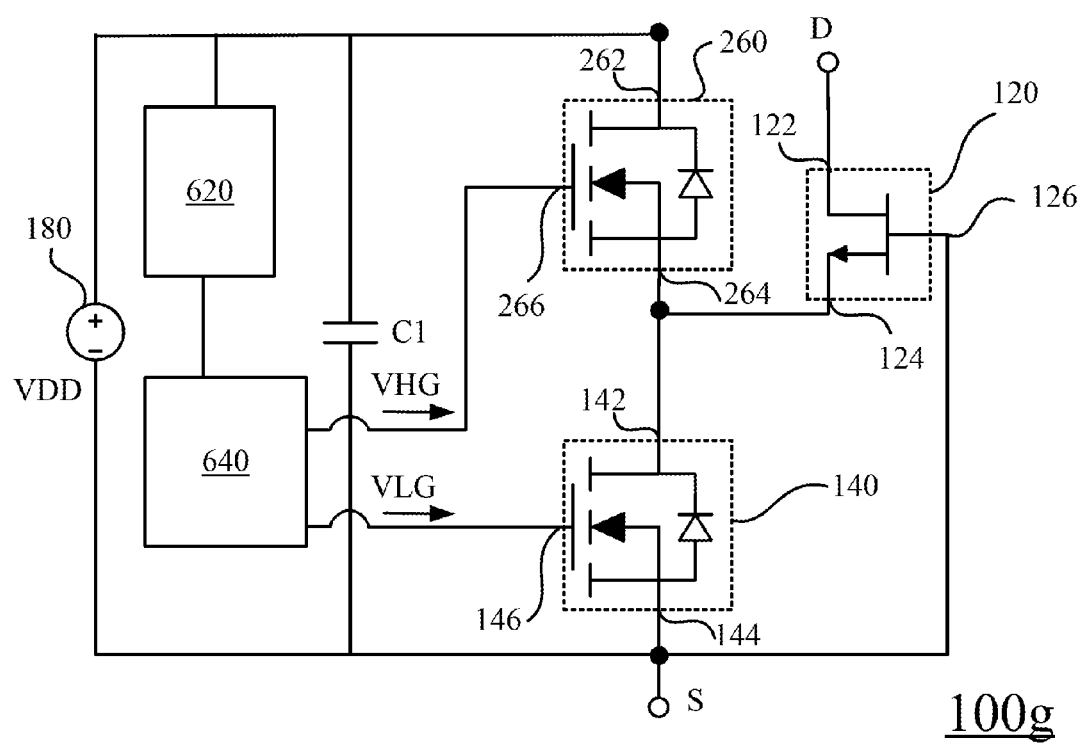
FIG. 6 is a diagram illustrating a switching circuit according to an embodiment of the present disclosure.

Reference is made to FIG. 6. FIG. 6 is a diagram illustrating a switching circuit 100g according to another embodiment of the present disclosure. In the present embodiment, the power source is configured to provide the dc level VDD and the switching circuit 100g further includes a capacitor C1, a control unit 640 and a protecting unit 620. The capacitor C1 is electrically connected to the power source 180 in parallel. The control unit 640 is electrically connected to the gate 266 of the switching unit 260 and the gate 146 of the normally-off switching element 140. The protecting unit 620 is electrically connected to the power source 180, the capacitor C1 and the control unit 640. In the present embodiment, the normally-off switching element 140 and the switching unit 260 are both n-type metal-oxide-semiconductor field-effect transistors.

The control unit 640 is configured to output a first control signal VLG and a second control signal VHG to the gate of the normally-off switching element 140 and the gate of the switching unit 260 respectively to control the normally-off switching element 140 and the switching unit 260 to be on or off.

The capacitor C1 is configured to use as the decoupling capacitor and provide high frequency current. The protecting unit 620 is configured to monitor the voltage value of the dc level VDD and output a protecting signal 621 when the voltage of the dc level VDD is lower than an undervoltage protection value $V_{UV}$, in which the control unit 640 is configured to turn off the normally-off switching element 140 according to the protecting signal 621. Alternatively stated, the first control signal VLG outputted by the control unit 640 is switched from the high level to the low level so as to turn off the normally-off switching element 140. In the present embodiment, the protecting unit 620 is an undervoltage protecting unit. The undervoltage protecting unit is configured to arrange the undervoltage protection value $V_{UV}$ to be larger than the opposite value of the threshold voltage $V_{TH\_M1}$ for the gate of the normally-on switching element 120. Alternatively stated, the undervoltage protection value $V_{UV}$ satisfies the following equation:

$$-V_{TH\_M1} \leq V_{UV}.$$

Thus, when the dc level VDD decreases and is lower than the undervoltage protection value $V_{UV}$, the control unit 640 is configured to control the normally-off switching element to be off. Due to the fact that the voltage (i.e., −VDD) of the gate of the normally-on switching element 120 is still larger than the threshold voltage $V_{TH\_M1}$ for the gate of the normally-on switching element 120, so the normally-on switching element 120 is still on. At this time, charger may flow though the conducting switching unit 260 reversely via the conducting normally-on switching element 120 charges the power source 180 and the capacitor C1 electrically connected in parallel, until the voltage of the dc level VDD rises back to the high enough to turn off the normally-on switching element 120.

In addition, the aforementioned circuit structure may also be used as the activated circuit when activating the switching circuit to charge the power source 180 and the capacitor C1. Due to the fact that the normally-on switching element 120 is on normally during activating the switching circuit, the voltage of the dc level VDD can be pulled up by charging the capacitor C1 and the power source 180 via the aforementioned switching unit 260.

Figure 7A:
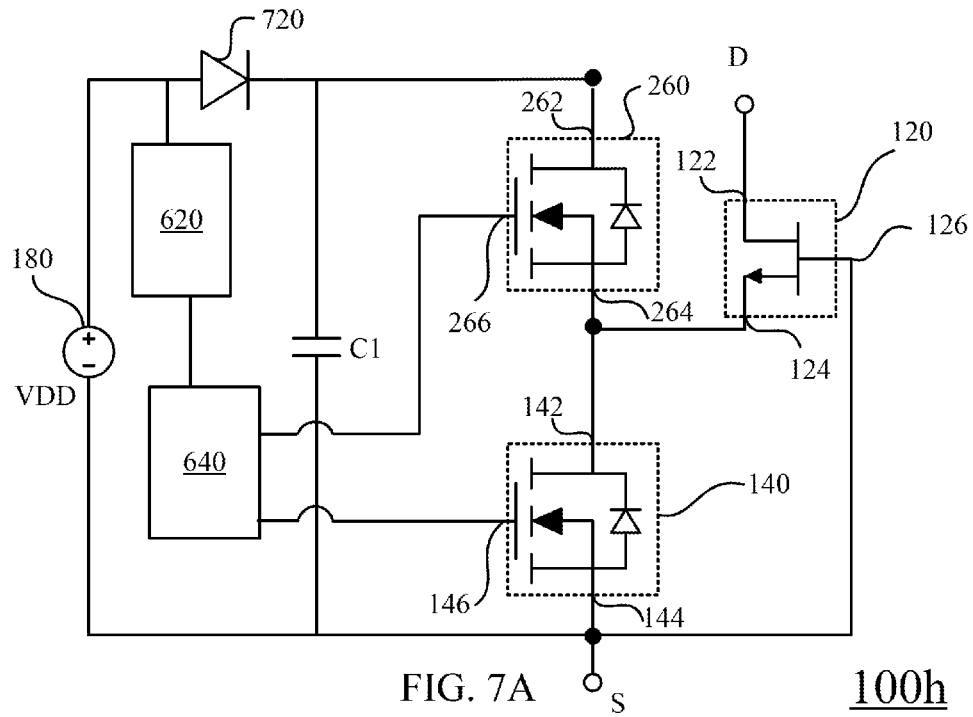
FIG. 7A-7B are diagrams illustrating a switching circuit according to an embodiment of the present disclosure.

Reference is made to FIG. 7A. FIG. 7A is a diagram illustrating a switching circuit 100h according to another embodiment of the present disclosure. In some embodiments, under the abnormal situation such as the power source 180 is damaged or short circuits happens, in order to avoid the power source 180 is charged by current unlimitedly, the switching circuit 100h may further connect the unidirectional conducting element 720 in series as shown in FIG. 7A.

In the present embodiment, an anode of the unidirectional conducting element 720 is electrically connected to the first terminal of the protecting unit 620 and the power source 180, and a cathode of the unidirectional conducting element 720 is electrically connected to the capacitor C1. When the voltage of the power source 180 is too low at the activation or other abnormal situation such that the aforementioned restriction −VTH_M1−VDD is not satisfied, by the blocking of the unidirectional conducting element 720, the risk that current flows from the main path through the normally-on switching element 120 and the switching unit 260 to the power source 180 is prevented, while the charger inputted from the main path can still charge the capacitor C1 to increase the dc level VDD configured to turn off the normally-on switching element 120. It is noted that in the present embodiment, the main path is referred to the circuit formed by the normally-on switching element 120 and the normally-off switching element 140.

Figure 7B:
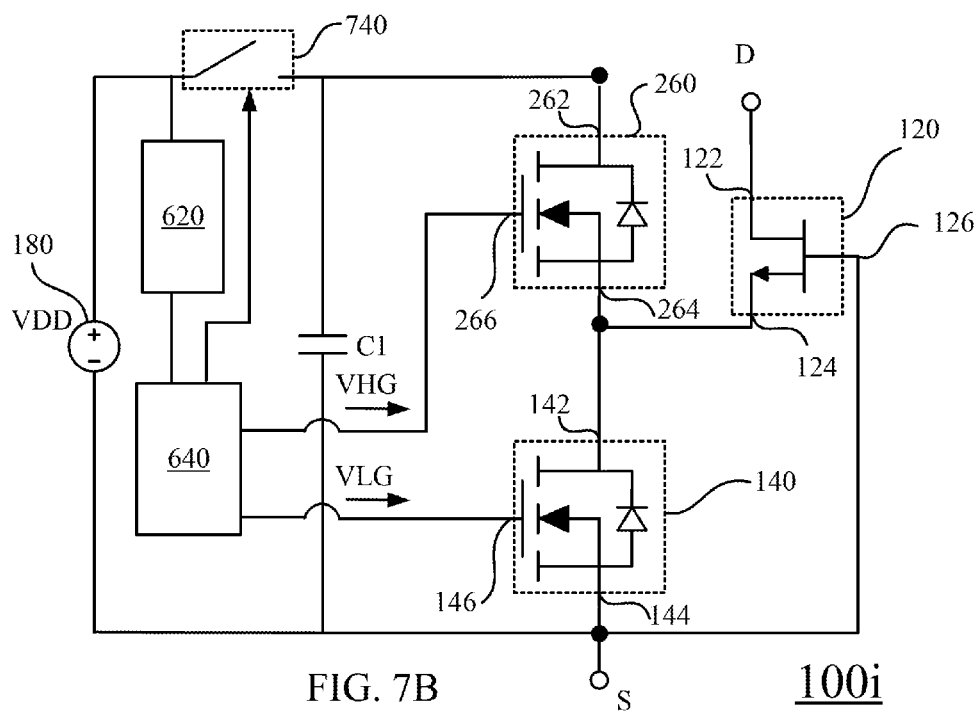

Reference is made to FIG. 7B. FIG. 7B is a diagram illustrating a switching circuit 100i according to another embodiment of the present disclosure. In the present embodiment, the fourth switching element 740 may be configured to replace the unidirectional conducting element 720 shown in the FIG. 7A to avoid the power source is charged by the current. A first terminal of the fourth switching element 740 is electrically connected to power source 180 and the first terminal of the protecting unit 620, a second terminal of the fourth switching element 740 is electrically connected to the capacitor C1, and a control terminal of the fourth switching element 740 is electrically connected to the control unit 640, in which the control unit 640 is configured to turn off the fourth switching element 740 when the protect unit 620 monitors the voltage value of the dc level VDD is lower than the undervoltage protection value $V_{UV}$.

Thus, the fourth switching element 740 may be configured to turn off when the dc level VDD is lower than the undervoltage protection value $V_{UV}$ to block the current from charging the power source 180. In another situation, for example, when activating the switching circuit (i.e., exhibiting the voltage on the main path and the power source 180 has not completed the activation), the control unit 640 is configured to turn on the fourth switching element 740 to charge the power source 180 and the capacitor C1 by the current from the main path.

It is noted that the switching unit 260 and the normally-off switching element 140 may be implemented by choosing proper transistors according to actual needs. For example, the switching unit 260 may be implemented by choosing p-type metal-oxide-semiconductor field-effect transistor or junction field-effect transistor to achieve similar functions and driving effects.

Figure 8A:
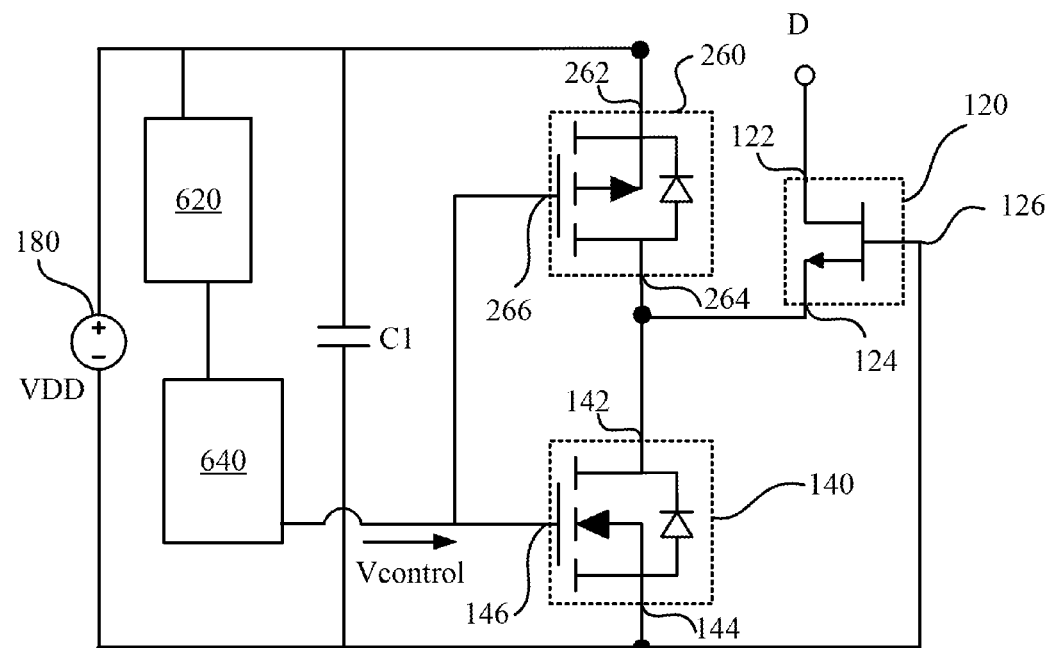
FIG. 8A-8B are diagrams illustrating a switching circuit according to an embodiment of the present disclosure.

Reference is made to FIG. 8A. FIG. 8A is a diagram illustrating a switching circuit 100j according to another embodiment of the present disclosure. In the present embodiment, the normally-off switching element 140 is a n-type metal-oxide-semiconductor field-effect transistor, and the switching unit 260 is a p-type metal-oxide-semiconductor field-effect transistor.

In the present embodiment, because the switching unit 260 chooses a p-type metal-oxide-semiconductor field-effect transistor, and the working state of the normally-off switching element 140 and the switching unit 260 are symmetric (i.e., when the normally-off switching element 140 is off, the switching unit 260 is on, and when the normally-off switching element 140 is on, the switching unit 260 is off), the control unit 640 is configure to output the control signal Vcontrol to the gate of the normally-off switching element 140 and of the switching unit 260 to control the normally-off switching element 140 and the switching unit 260 to be on or off respectively. Alternatively stated, the control signal configured to control the normally-off switching element 140 and the control signal configured to control the switching unit 260 is simplified to one single control signal.

It is noted that in the present embodiment, the threshold voltage $V_{TH\_MX}$ for the gate of the switching unit 260 matches to the threshold voltage $V_{TH\_M2}$ for the gate of the normally-off switching element 140 and the dc level VDD, to avoid the switching unit 260 and the normally-off switching element 140 are on at the same time causing the capacitor C1 and the power source 180 shorted. Specifically, the threshold voltage $V_{TH\_MX}$ and the threshold voltage $V_{TH\_M2}$ satisfy the following equation:

$$VDD \leq V_{TH\_M2} - V_{TH\_MX}$$

It is noted that the normally-off switching element 140 is the n-type metal-oxide-semiconductor field-effect transistor and the switching unit 260 is the p-type metal-oxide-semiconductor field-effect transistor, so the threshold voltage $V_{TH\_M2}$ for the gate of the normally-off switching element 140 is positive, and the threshold voltage $V_{TH\_MX}$ for the gate of the switching unit 260 is negative.

When the threshold voltage $V_{TH\_MX}$ for the gate of the switching unit 260 does not match to the threshold voltage $V_{TH\_M2}$ for the gate of the normally-off switching element 140, a level shift unit may be arranged in the switching circuit to avoid the switching unit 260 and the normally-off switching element 140 are on at the same time.

Figure 8B:
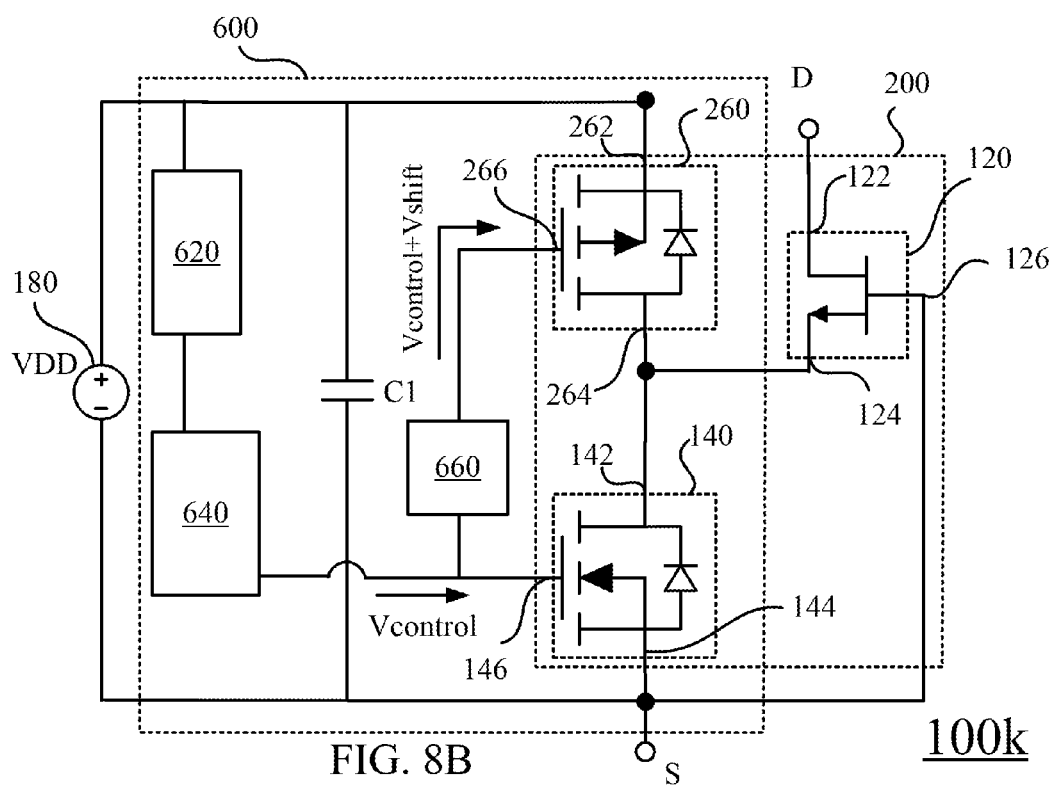

Reference is made to FIG. 8B. FIG. 8B is a diagram illustrating a switching circuit 100k according to another embodiment of the present disclosure. In the present embodiment, the switching circuit 100k further includes the level shift unit 660. The level shift unit 660 is configured to pull the control signal Vcontrol up by a shifting level value Vshift to output a second control signal to send the pulled up control signal (i.e., Vcontorl+Vshift) to the gate 266 of the switching unit 260.

Specifically, in the present embodiment the shifting level value Vshift satisfies the following equation:

$$VDD - V_{TH\_M2} + V_{TH\_MX} \leq Vshift \leq VDD + V_{TH\_MX}$$

Thus, the control signal Vcontrol is assured not to turn on the switching unit 260 and the normally-off switching element 140 at the same time, and configured to control the switching unit 260 to be on or off ideally.

The functional unit and switching element in the above embodiments may be independent and connected to each other via system wires, and package method may also be applied to integrate any two or more functional unit and switching element. For example, when the normally-off switching element 140, the switching unit 260, the protecting unit 620, the control unit 640 and the level shift unit 660 are made by the same material (e.g., Si), the elements may be integrated through an application specific integrated circuit (ASIC) as a driving-control chip 600 to perform the operation accompanied by the normally-on switching element 120.

On the other hand, because a large current will flow in the normally-on switching element 120, the normally-off switching element 140 and the switching unit 260 and generate losses during the switching circuit operations, and the connection wires between the above switching elements has a significant impact on the total system operation efficiency, Any two or more of the normally-on switching element 120, the normally-off switching element 140 and the switching unit 260 may be integrated on a single chip and implemented as a power switching element.

Figure 9:
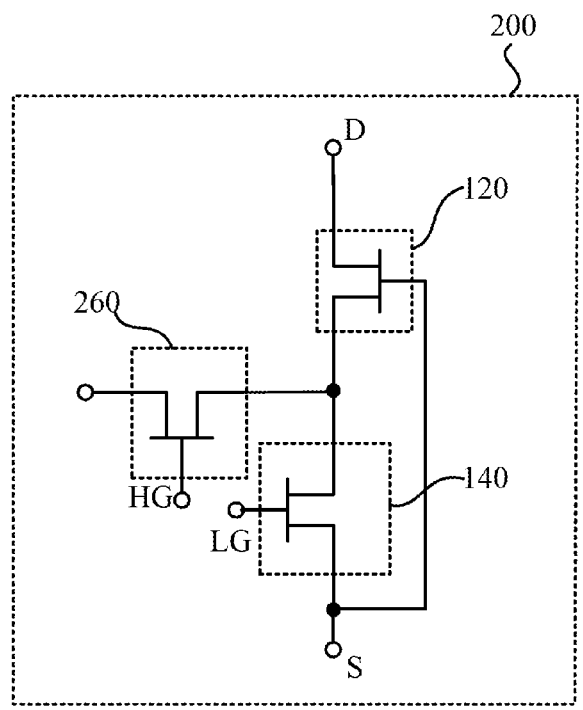
FIG. 9 is a diagram illustrating a power switching element according to an embodiment of the present disclosure.
Figure 10A:
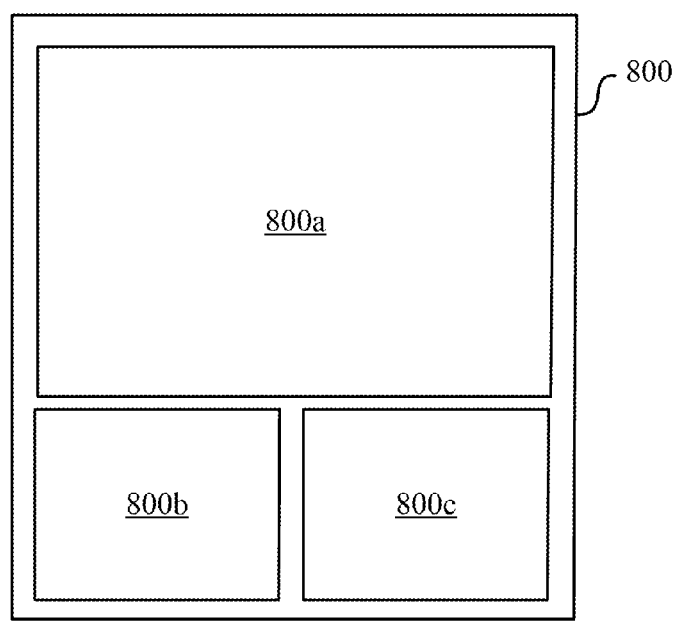
FIG. 10A-10E are diagrams illustrating integrated chips according to an embodiment of the present disclosure.

Reference is made to FIG. 9. FIG. 9 is an diagram illustrating a power switching element 200 according to an embodiment of the present disclosure. In the present embodiment, the normally-on switching element 120 is a normally-on Gallium Nitride (GaN) element, and the normally-off switching element 140 and the switching unit 260 are normally-off Gallium Nitride elements. Reference is made to FIG. 10A in accompany. As shown in FIG. 10A, the normally-on switching element 120, the normally-off switching element 140 and the switching unit 260 are implemented on a chip 800, and distributed on different chip region 800a, 800b and 800c respectively. In some embodiments, because the normally-on switching element 120 is a high voltage switching element and the normally-off switching element 140 and the switching unit 260 are low voltage switching elements, so the area for the normally-on switching element on the chip (i.e., the area of the chip region 800a) is larger than an area for the normally-off switching element on the chip (i.e., the area of the chip region 800b) and an area for the switching unit on the chip (i.e., the area of the chip region 800c).

Figure 10B:
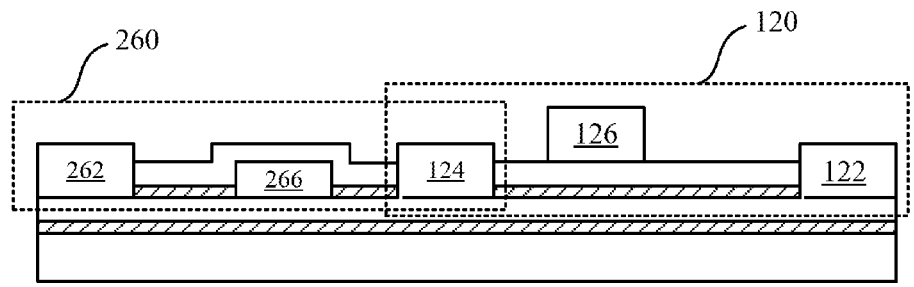
Figure 10C:
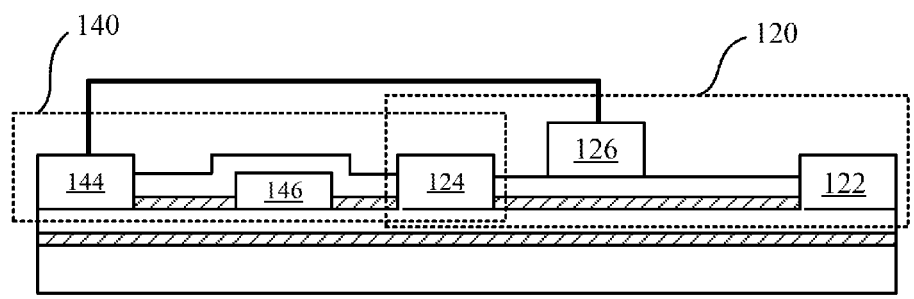
Figure 10D:
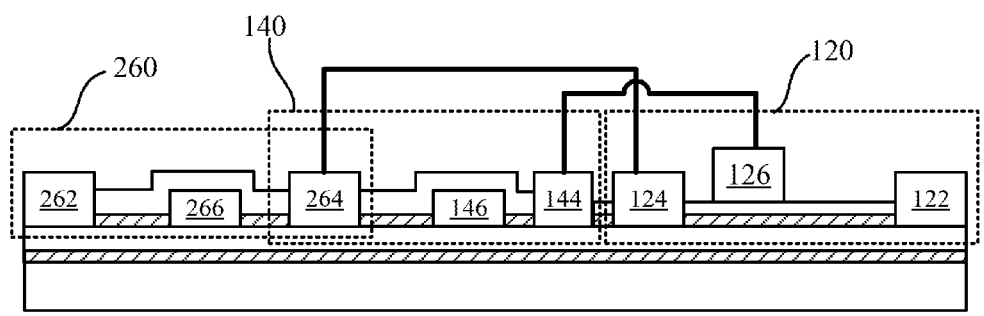

In addition, besides the region division distributing different chip region to different elements, it is also practical to distribute elements by interval arrangement, as shown in FIG. 10B, FIG. 10C, and FIG. 10D. In the embodiment shown in FIG. 10B, the normally-on switching element 120 and the switching unit 260 are integrated and aligned in interval arrangement. In the embodiment shown in FIG. 10B, the normally-on switching element 120 and the normally-off switching element 140 are integrated and aligned in interval arrangement. In the embodiment shown in FIG. 10B, the normally-on switching element 120, the normally-off switching element 140 and the switching unit 260 are integrated and aligned in interval arrangement. In the embodiments shown in FIG. 10B-10D, elements are adjacently aligned and connected to lower the parasitic parameters to minimize the parasitic parameters.

Figure 10E:
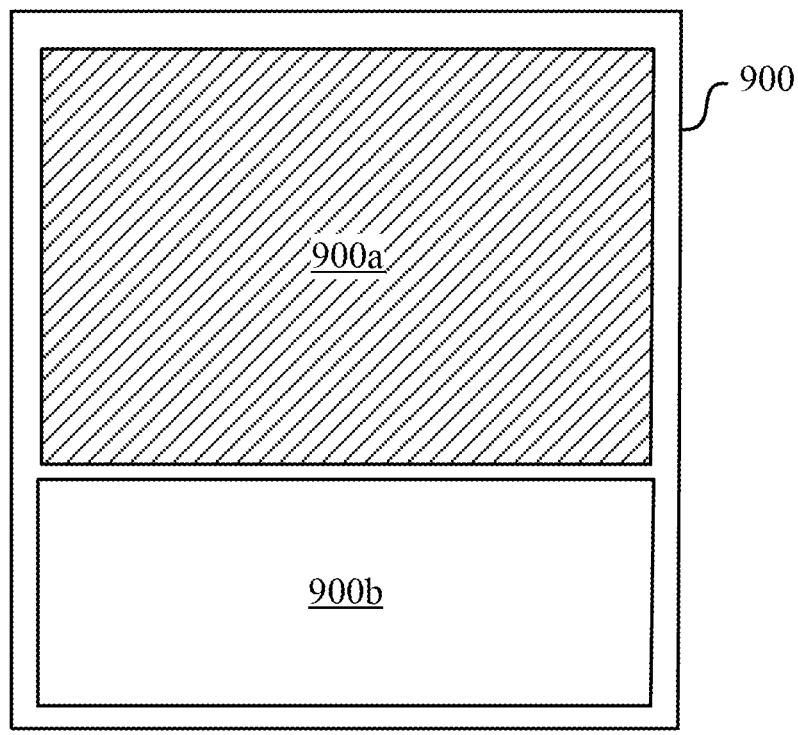

In addition, as shown in FIG. 10E, a mixture arrangement may be adopted, using the region division distribution and the interval arrangement distribution at the same time according to the practical needs. For example, in the present embodiment, the normally-on switching element 120 and the switching unit 260 are integrated and aligned in interval arrangement (as shown in FIG. 10B on the chip region 900a in the chip 900, and the normally-off switching element 140 is distributed on the chip region 900b in the chip 900.

In summary, technical solutions of the present disclosure have advantages and beneficial effects compared to present technical solutions. The aforementioned technical solutions can be widely used in industry. In the present disclosure, by applying the above embodiments, the switching unit is arranged to control the voltage level of the gate of the high voltage normally-on switching element consistently as well as maintain the high speed switching performance.

Although the disclosure has been described in considerable detail with reference to certain embodiments thereof, it will be understood that the embodiments are not intended to limit the disclosure. It will be apparent to those skilled in the art that various modifications and variations can be made to the structure of the present disclosure without departing from the scope or spirit of the disclosure. In view of the foregoing, it is intended that the present disclosure cover modifications and variations of this disclosure provided they fall within the scope of the following claims.

What is claimed is:

1. A switching circuit, comprising:
   a normally-on switching element;
   a normally-off switching element, wherein a drain of the normally-off switching element is electrically connected to a source of the normally-on switching element, and a source of the normally-off switching element is directly electrically connected to a gate of the normally-on switching element;
   a switching unit; and
   a power source, wherein the power source and the switching unit are configured to form a serial-connected branch and a first terminal of the serial-connected branch is electrically connected to the drain of the normally-off switching element, and a second terminal of the serial-connected branch is electrically connected to the source of the normally-off switching element.

2. The switching circuit of claim 1, wherein a first terminal of the switching unit is electrically connected to the drain of the normally-off switching element, a second terminal of the switching unit is electrically connected to a first terminal of the power source, and a second terminal of the power source is electrically connected to the source of the normally-off switching element.

3. The switching circuit of claim 1, wherein a first terminal of the power source is electrically connected to the drain of the normally-off switching element, a second terminal of the power source is electrically connected to a first terminal of the switching unit, and a second terminal of the switching unit is electrically connected to the source of the normally-off switching element.

4. The switching circuit of claim 1, wherein the power source is configured to provide a dc level and the dc level satisfies the equation:

$$-V_{TH\_M1} \le VDD \le -V_{MIN\_GATE}$$

wherein VDD is the dc level, $V_{TH\_M1}$ is a gate threshold voltage of the normally-on switching element, and $V_{MIN\_GATE}$ is a lower limit of the safe operating area for the gate voltage of the normally-on switching element.

5. The switching circuit of claim 1, wherein a withstand voltage of the normally-off switching element and the switching unit satisfies the equation:

$$VDD \le V_{BR}$$

wherein VDD is the dc level, $V_{BR}$ is the withstand voltage of the normally-off switching element and the switching unit.

6. The switching circuit of claim 1, wherein the switching unit is a unidirectional conducting element.

7. The switching circuit of claim 6, wherein the switching unit is a diode or a metal-oxide-semiconductor field-effect transistor with the gate and the source connected.

8. The switching circuit of claim 1, wherein the drain of the normally-on switching element is an input terminal, the source of the normally-off switching element is an output terminal, and the gate of the normally-off switching element is configured to receive a control signal to control the switching circuit to be on or off.

9. The switching circuit of claim 1, wherein the normally-off switching element and the switching unit are n-type metal-oxide-semiconductor field-effect transistors, and a source of the switching unit is electrically connected to the drain of the normally-off switching element;
   the power source is configured to provide a dc level, and a drain of the switching unit is electrically connected to a positive terminal of the power source, and the source of the normally-off switching element is electrically connected to a negative terminal of the power source; and
   during a turn-off process of the switching circuit, the voltage level of the gate of the normally-off switching element is switched from a high level to a low level at a first time, and the voltage level of a gate of the switching unit is switched from a low level to a high level at a second time after the first time.

10. The switching circuit of claim 9, wherein during a turn-on process of the switching circuit, the voltage level of the gate of the switching unit is switched from the high level to the low level at a third time, and the voltage level of the gate of the normally-off switching element is switched from the low level to the high level at a fourth time after the third time.

11. The switching circuit of claim 10, wherein the time difference between the first time and the second time, and the time difference between the third time and the fourth time are between about 0.01 nanosecond and about 1 microsecond.

12. The switching circuit of claim 1, wherein the power source is configured to provide a dc level and the switching circuit further comprises:
- a capacitor electrically connected to the power source in parallel;
- a control unit electrically connected to the gate of the switching unit and the gate of the normally-off switching element; and
- a protecting unit electrically connected to the power source, the capacitor and the control unit, wherein the protecting unit is configured to monitor the voltage of the dc level and output a protecting signal when the voltage of the dc level is lower than an undervoltage protection value, wherein the control unit is configured to turn off the normally-off switching element according to the protecting signal.

13. The switching circuit of claim 12, wherein the normally-off switching element is a n-type metal-oxide-semiconductor field-effect transistor, the switching unit is a n-type metal-oxide-semiconductor field-effect transistor, and the control unit is configured to output a first control signal and a second control signal to the gate of the normally-off switching element and the gate of the switching unit respectively to control the normally-off switching element and the switching unit to be on or off.

14. The switching circuit of claim 12, wherein the undervoltage protection value satisfies the equation:

$$-V_{TH\_M1} \leq V_{UV}$$

wherein $V_{TH\_M1}$ is the threshold voltage for the gate of the normally-on switching element, and $V_{UV}$ is the undervoltage protection value.

15. The switching circuit of the claim 12, further comprising:
- an unidirectional conducting element, wherein an anode of the unidirectional conducting element is electrically connected to the protecting unit, and a cathode of the unidirectional conducting element is electrically connected to the capacitor.

16. The switching circuit of claim 12, further comprising:
- a fourth switching element, wherein a first terminal of the fourth switching element is electrically connected to the protecting unit, a second terminal of the fourth switching element is electrically connected to the capacitor, and a control terminal of the fourth switching element is electrically connected to the control unit, wherein the control unit is configured to turn off the fourth switching element when the protecting unit monitors the voltage value of the dc level is lower than the undervoltage protection value, and the control unit is configured to turn on the fourth switching element when the switching circuit is activated.

17. The switching circuit of claim 12, wherein the normally-off switching element is a n-type metal-oxide-semiconductor field-effect transistor, and the switching unit is a p-type metal-oxide-semiconductor field-effect transistor, wherein the control unit is configured to output a control signal to the gate of the normally-off switching element and the gate of the switching unit and the control signal is configured to control the normally-off switching element and the switching unit to be on or off.

18. The switching circuit of claim 17, further comprising:
- a level shift unit configured to pull the control signal up by a shifting level value to output a second control signal and send the second control signal pulled up to the gate of switching unit.

19. The switching circuit of claim 18, wherein the shifting level value satisfies the equation:

$$VDD - V_{TH\_M2} + V_{TH\_MX} \leq V_{shift} \leq VDD + V_{TH\_MX}$$

wherein $V_{shift}$ is the shifting level value, $V_{TH\_M2}$ is the threshold voltage for the gate of the normally-off switching element, $V_{TH\_MX}$ is the threshold voltage for the gate of the switching unit, and VDD is the dc level.

20. The switching circuit of claim 1, wherein the normally-on switching element, the normally-off switching element and the switching unit are implemented on a chip, and an area for the normally-on switching element on the chip is larger than an area for the normally-off switching element on the chip and an area for the switching unit on the chip.

21. The switching circuit of claim 1, wherein the normally-on switching element, the normally-off switching element and the switching unit are implemented on a chip, and at least two of the normally-on switching element, the normally-off switching element and the switching unit are integrated on the chip.

* * * * *